(12) United States Patent
Collette et al.

(10) Patent No.: US 6,528,716 B2
(45) Date of Patent: Mar. 4, 2003

(54) SOLAR CONCENTRATOR

(75) Inventors: Jean-Paul Collette, Embourg (BE); Jean-Marc Defise, Plainevaux (BE); Serge Habraken, Comblain-Au-Pont (BE)

(73) Assignee: Universite de Liege, Liege (BE)

( * ) Notice: Subject to any disclaimer, the term of this patent is extended or adjusted under 35 U.S.C. 154(b) by 0 days.

(21) Appl. No.: 09/908,816

(22) Filed: Jul. 20, 2001

(65) Prior Publication Data

US 2002/0007845 A1 Jan. 24, 2002

(30) Foreign Application Priority Data

Jul. 20, 2000 (EP) .............................................. 00202669

(51) Int. Cl.$^7$ ..................... H01L 31/045; H01L 31/052; B64G 1/44
(52) U.S. Cl. ..................... 136/246; 136/245; 136/244; 136/291; 136/292; 257/436
(58) Field of Search ................................ 136/246, 245, 136/244, 291, 292; 257/436

(56) References Cited

U.S. PATENT DOCUMENTS

| | | | |
|---|---|---|---|
| 3,232,795 A | * | 2/1966 | Gillette ........................ 136/246 |
| 3,350,234 A | * | 10/1967 | Ule ............................. 136/246 |
| 3,427,200 A | * | 2/1969 | Lapin et al. ................. 136/246 |
| 4,415,759 A | | 11/1983 | Copeland et al. |
| 5,520,747 A | | 5/1996 | Marks |
| 5,885,367 A | | 3/1999 | Brown et al. |
| 5,909,860 A | | 6/1999 | Lee |
| 6,017,002 A | | 1/2000 | Burke et al. |
| 6,050,526 A | | 4/2000 | Stribling, Jr. |
| 6,051,774 A | * | 4/2000 | Yoshida et al. ............. 136/244 |
| 6,177,627 B1 | * | 1/2001 | Murphy et al. ............. 136/246 |
| 6,188,012 B1 | * | 2/2001 | Ralph .......................... 136/246 |

FOREIGN PATENT DOCUMENTS

JP  4-215599 A  *  8/1992

* cited by examiner

*Primary Examiner*—Alan Diamond
(74) *Attorney, Agent, or Firm*—Jacobson Holman, PLLC

(57) ABSTRACT

A space solar concentrator based on light-weight reflectors (3) attached to a honeycomb panel (1) is described. The integration of the reflectors (3) allows for a high modularity. Solar panel deployment is not perturbed by the reflectors (3) even with two-dimensional deployment concept. Each reflector (3) consists in small saw tooth aligned as rows (2) with solar cell rows in between. Low concentration is achieved with a high level of thermal control and a high optical efficiency. When small off-pointing occurs, the solar flux distribution is still the same on each cells. It guarantees a good electrical control and management on the whole panel. The reflectors (3) are preferably made of a thin film tight on a light-weight rigid frame deployed after launch. In another embodiment, the reflector is not deployable and is part of the panel substrate. A stowed configuration allows for superimposition of the solar panel. High reflectivity of the reflectors results from the use of vacuum deposited aluminum or preferentially over-protected silver.

26 Claims, 8 Drawing Sheets

SOLAR CONCENTRATOR

The present invention relates to a solar concentrator, particularly a space solar concentrator, to form a solar panel.

Spacecraft typically carries solar cells as a primary energy source. The solar cells are positioned and oriented on the spacecraft so that they are exposed to solar radiation.

On body-stabilized spacecraft, solar cells are typically arranged in planar arrays and carried on solar wings which extend from opposite sides of a spacecraft body. Preferably, the solar wings rotate to keep them as orthogonal to the solar radiation as possible. Because the solar wings can be quite long in their deployed configuration, they are generally formed of a plurality of planar solar panels which are coupled together in an accordion arrangement (one-dimensional deployment) or in a paving arrangement (two-dimensional deployment) so that they can be collapsed to a smaller stowed configuration for spacecraft launch.

The number of solar cells that must be carried by a spacecraft is a function of the anticipated spacecraft power demand and the efficiency of the solar cells. Although high-efficiency solar cells reduce the number of cells required by a specific spacecraft, they are quite expensive. Because weight and weight-related costs also increase with the number of solar cells, there is a considerable incentive to reduce the quantity of solar cells that a spacecraft must carry.

Accordingly, efforts have been extended to concentrate solar radiation upon solar cells by using reflective surfaces that are positioned adjacent to solar panels and oriented to reflect additional radiation onto the cells. Solar radiation that would otherwise have passed by a solar wing is thus redirected to be incident upon the solar cells. Although a solar cell's efficiency in conversion of this additional reflected radiation to useful energy is typically less than it is for the directly incident radiation, primarily due to increased cell temperature and slanted angle of incidence, solar concentration allows the number of spacecraft solar cells to be significantly reduced with consequent savings in spacecraft weight and cost. Both rigid and flexible reflectors have been proposed for solar radiation concentration with flexible reflectors generally having a weight advantage. An exemplary flexible reflector system is shown in U.S. Pat. Nos. 6,017,002 and 6,050,526. An exemplary rigid reflector system is shown in U.S. Pat. No. 5,520,747.

Although these reflector systems concentrate solar radiation, their positioning adjacent to solar panel give rise to several drawbacks. The solar cell temperature increases and consequently the power conversion efficiency decreases. The pointing errors induces lack of flux uniformity on the cell panel and the power management is complicated, consequently decreasing the panel electric power collection.

In the case of deployable reflectors, the position of the reflectors and their deployment is not easily compatible with a two-dimensional deployment of the solar panels (paving-type panels) but only with a one-dimensional deployment thereof (accordion panels). Reflectors described in U.S. Pat. No. 5,520,747 present another pertinent drawback. The solar reflectors are stowed over the solar cell face of the solar panels. Accordingly, they block the use of the solar panels during any period (e.g., a transfer orbit) in which the solar panels are in a storage position that prevents reflector deployment. Moreover, the entire spacecraft power generation can be jeopardized in case of failure during reflector deployment.

Another type of concentration with reflectors consists in distributing small reflectors on the solar panel. Reflectors are laying in between solar cell rows, alternatively. It reduces or cancels several of the mentioned drawbacks. The present invention according to its second aspect is related to this kind of configuration. U.S. Pat. No. 6,188,012 and WO 00/79593 A1 are also describing some embodiments based on this geometric concept.

U.S. Pat. No. 6,188,012 applies only to a deployable concentrator. The deployment of the reflector is ensured thanks to several kinds of springs. After deployment, the spring is used to keep the reflective film under tension. The main drawback of such a device is the mechanical fatigue that occurs after a long time in space (with thermal cycling during each eclipse). For telecommunication spacecraft, the solar array must stay fully operational for 15 years in geostationary orbit. One eclipse per day occurs. More than 5,000 thermal cycles will result from more than 5,000 daily eclipses. If the reflector tension is progressively altered due to spring relaxation, the optical quality and the illumination uniformity will degrade. The effective concentration factor will vanish, with a significant loss for the spacecraft power generation. For that reason, after deployment, the reflective films need a fixer to ensure that no more mobility can produce the loss of tension. This patent is furthermore presenting deployment/storage concepts that are not fully valid. When the reflectors are stowed, their length looks smaller than when they are in deployed configuration. A realistic drawing would certainly depicts that, in the stowed configuration, the reflector film is partially shading the solar cells. In case of reflector deployment failure, the reflective films are shadowing the solar cells and the resulting power generation is vanishing. This is another drawback that one aspect of the present invention intends to avoid.

WO 00/79593 A1 is presenting a concept with self-deployable reflectors. They are clearly shadowing the cells in the stowed configuration. There is no blocking mechanism after deployment. During storage, the solar panels are conventionally mounted in stack with small space in between. The stowed reflectors are using this available space but, since no locking mechanisms are present in the stowed configuration, the reflectors of panel i are collapsed against reflectors from the next panel (i+1).

This configuration is doubtful since vibration (during transportation and launch, for instance) could generate scratches on the reflective films, altering the optical quality and later the effective solar concentration with a loss of power generation.

A solar concentrator according to a first aspect of the invention is defined in claim 1. It aims at providing a compact and robust structure, the rigidity of which is achieved by a combination of wedge-like reflectors and an honey comb panel, which also brings an enhanced cooling efficiency.

Further advantageous embodiments of this concept appear in the sub-claims.

With rigid reflectors (without deployment sequence), the geometric concentration is preferentially reduced to 1.6:1 in order to significantly reduce the reflector height (46% of the height of a reflector with concentration 2:1). The resulting solar array has a height which is still very close to the one of an array without concentration (no reflectors) and no unsafe deployment occurs, which greatly enhances the reliability of the concept.

A solar concentrator according to the first aspect of the present invention is composed of a rigid solar panel with rows of solar cells and reflectors (sawtooth shape) alternatively attached to the panel. The reflectors may be oriented at 30 degrees with respect to the perpendicular to the panel to reflect solar flux into cells with a concentration factor of 2:1. The reflector size depends on the solar cell size and concentration factor. When concentration factor is 2:1, the width is the same as the cell width. The length is the same as the panel element length.

According to a second aspect of the invention, the sawtooth (or wedge like) reflectors are deployable, and in the stowed position, the reflectors do not overlap the cell rows.

After deployment, reflectors collect and concentrate the solar flux to the cells. Before deployment of the reflectors, one of the preferred embodiment uses reflectors folded on the panel substrate to keep the folded geometry as compact as the one reached by a classic rigid panel without concentrator.

According to the first or second aspect of the invention, the reflectors may be made of thin film with metal deposited onto. In one of the embodiments, the film can be tight on a rigid light-weight frame with applied pre tension. In another embodiment, only half of the reflector is made of a film tight on a rigid frame. In another embodiment, the reflectors are made of rigid light-weight material like Carbon Fiber Reinforced Polymer (CFRP) or thin Nickel sheet. In another embodiment of the invention, the reflectors are made of thin film without rigid frame, bonded to the panel substrate at the edges or integrated in the panel structure. The film shape is produced by tension thanks to arms (possibly deployable) bonded to the panel and reaching the roof of the saw tooth reflector(s).

In the present invention, reflectors are replacing solar cell rows. The weight of GaAs solar cell is about 0.85 kg/m$^2$. Including coverglass, connections and wires, the weight of a solar cell row is about 1.2 kg/m$^2$. A thin film reflector is dramatically lighter. For instance, a 50 micron (2 mils) Kapton® film weights 71 g/m$^2$ or a 10 micron Ni alloy shim weights 89 g/m$^2$ only. Even including structural and mechanical parts for stowage locking, deployment, and final blocking, the weight of the solar panel is never increased by the addition of reflectors according to the invention. The reflective film can be made of other substrate than Kapton. For instance Mylar® and LaRC CP-1 films are good alternatives.

From the cost point of view, solar reflectors are less expensive than the equivalent solar cell area, which constitutes an additional improvement of the present invention.

Since body-stabilized spacecraft are equipped with a one-axis tracking capability, the pointing is relatively precise in the east-west plane (about ±2 degrees). No tracking is performed in the north-south plane. It results in a seasonal variation of the panel orientation with respect to the sun. About ±23.5 degrees variation occurs in the north-south axis. For that reason, concentrator are often linear, concentrating sunlight in the direction where tracking is performed. For that purpose, the present reflector rows are oriented along the north-south axis and concentrate solar flux in the tracking axis only. The trough reflector-type with a geometric concentration of 2:1 and reflectors oriented at 60 degrees with respect to solar panel reaches a collection efficiency loss of 10% when the off-pointing in the tracking axis is ±6.5 degrees. This never happens unless attitude control gets lost. Since no concentration is performed in the other axis, the seasonal variation has no significant influence on the solar flux collection, compared to solar panel with no concentration.

The use of solar reflectors integrated in the solar panel allows for a more versatile and modular design of the deployed solar panel, compared with the previous invention where reflectors are adjacent to solar panels (trough-type concentrators). Indeed, in the later case, the solar panel deployment will more easily happens only in a one-dimensional sequence, accordion-type. It results in a wide wingspan with alignment and control complexity. The present invention is still compatible with more complex deployment schemes like two-dimensional paving. The modularity is significantly improved compared to the previously mentioned inventions.

The thermal behaviour of solar panel is an important parameter.

The prior art trough-type concentrator (see for e.g. FIG. 2) increases the solar flux on the panel but there is no easy way to reject the additional heat. The cell temperature increases by 30–40 degrees resulting in an unwanted cell efficiency decrease. This is mainly due to the fact that the flux collection surface is increased by the reflectors but the cooling is still coming from the same area: the panel rear and front surfaces, which are facing the cold space environment.

In the present invention, reflectors are mounted on the panel and the solar flux is still concentrated by the same amount on the solar cell rows. However, the collection surface is not significantly enlarged. It remains almost identical to the non concentration panel surface where the cooling surface is the same as the sun irradiated surface. Only a small temperature increase is expected. The power conversion efficiency is better compared to trough concentrators.

With a one-axis solar tracking, 1 or 2 degrees off-pointing currently occurs. The solar flux distribution on the panel is perturbed. The distribution is no more uniform.

In a trough-type concentration panel, off-pointing will overexpose some cell rows and underexpose other rows. The photovoltaic cells perform the electric conversion. The produced electric current is directly related to the absorbed solar flux. Some cell rows will produce larger current than others. The serial connection of cells is not compatible with such a current variation. Unless large improvement of the power management is introduced, this non uniformity induces loss of electric power collection for the whole panel.

The present invention does not suffer from this drawback of uniformity lack. Since each pair of reflectors is acting on a single cell row, the offpointing induces a non uniform flux, distributed along the width of each cell and identical for each cell. The cell power conversion is identically affected on each cell and on each cell row. The induced electric current is still the same for each cell. The power collection by serial connection is no more affected. Power management is unchanged compared to non concentration panel and no additional loss is observed due to the off-pointing.

High Reflectivity of the reflectors results from the use of vacuum deposited aluminum (VDA) or preferentially overprotected silver coatings. Other coatings can be used as long as high solar reflectivity is produced. In the cell response spectrum, the average reflectivity of aluminum film at 60 degrees incidence with respect to the reflector normal is about 89%. Silver coating protected with SiO2 optimized thin layer, for instance, enhances the average reflectivity in the same condition to 97%. The over cost is easily compensated by the solar flux collection improvement.

The reflectors used in the present invention look like narrow tape. The width is about the same size as the cell width (±40 mm). Film quality like micro-roughness or shape accuracy is more tolerant or easier to accommodate than the large reflectors used in a trough-type concentrator (typical width ~2 m). This makes the design and manufacturing of the film and support easier. It also could contribute to reduce the weight of reflectors.

The invention will be further described in conjunction with the drawings, wherein:

BRIEF DESCRIPTION OF THE DRAWINGS

FIGS. 3 A and B depict respectively the collection efficiency CE due to tracking error in concentration types shown in FIG. 1 and 2 and the distribution of light on the solar panel resulting from 3 degrees off-pointing.

In FIG. 3A, efficiency E is plotted against angle of incidence α which gives a curve of collective efficiency CE (CL designating the cosine law and CF the corrected flux). In FIG. 3B the normalized flux NF is plotted against the normalized ordinate NO along the off-pointing axis.

FIGS. 5A to E relate to several embodiments of the present invention in deployed configuration:

5A: saw tooth reflector made of thin film on a rigid light-weight Al frame.

5B: half of the saw tooth reflector identical to FIG. 5A and the other half made of tight thin film only.

5C: saw tooth is made of thin film only. Tension is produced by blocked rigid arms at the roof top.

5D: rigid panel including saw tooth reflectors with no deployment capability. In the illustrated embodiment, the concentration factor is 1.6:1.

5E: saw tooth made of an inflatable structure. Deployment to the correct shape comes from the inflation of the membrane reflector. Reflective coating is deposited on the membrane material.

FIGS. 6A to C shows several embodiments of the present invention in stowed configuration (for launch).

6A: embodiment of FIG. 5B showing reflectors locked in stowed position

6B: embodiment of FIG. 5C showing reflectors locked in stowed position

6C: embodiment of FIG. 5D with two adjacent solar panels in stowed position

FIGS. 7A and 7B illustrate the enhancement of the heat transfer inside the sandwich honeycomb structure of the solar panel.

7A: thin additional honeycomb with open black painted (or black coated) cells mounted on the rear face sheet of the solar panel 7B: view of the rear face sheet with open (cut) area under the rows of solar cells to allow the honeycomb cells for directly facing the cold space environment.

Figure 1:
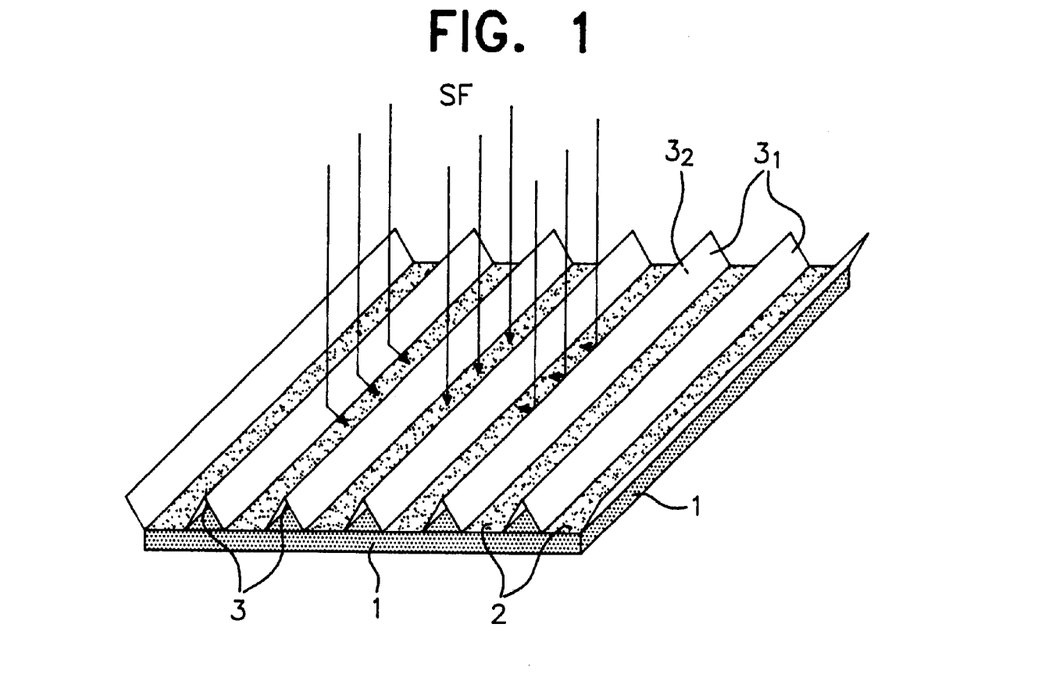
FIG. 1 is a conceptual view of a solar concentrator according to a first aspect of the invention. The reflectors look like sawteeth (or tents) in rows with solar cell rows in between. In the illustrated embodiment, the concentration factor is 2:1.

Referring to FIG. 1, a solar concentrator according to the present invention is illustrated. Rows of saw tooth reflectors 3 having two planar or bent sides $3_1$ and $3_2$ and of solar cells 2 are alternatively presented. They are mounted on a honeycomb panel structure 1. This honeycomb structure comprises a base 1 made of an aluminum honeycomb sandwiched between two CFRP (Carbon Fiber Reinforced Polymer) face sheets. The saw-tooth profile 3 is comprised of inclined sides $3_1$ and $3_2$ separated by flat regions, each receiving a row 2 of solar cells. The inclined sides are provided with a reflective coating. The solar radiation is incident on front side of the panel. It will reach the solar cells either directly, or after reflection on the reflective coating of the saw-tooth profiles 3. In one preferred embodiment, row width is identical for the cells 2 and for the saw-tooth reflectors 3. The inclination angle of the sides of the reflector may be set to 30 degrees with respect to the perpendicular to the base panel 1. In this case, the geometric concentration factor is 2:1. It means that two square meters of solar radiation are concentrated on one square meter of solar cells. Since high-efficiency solar cells are very expensive, concentration is very attractive to reduce the costs.

The inclined solar reflectors 3 are made of thin film on which a reflective coating (e.g. metal) is deposited. The thin film may be Mylar®, Kapton®, LaRC CP-1 or any lightweight and mechanically resistant material. The film thickness depends on the required mechanical strength. Typical thickness is from about 13 microns to 125 microns, and films of that thickness are currently available.

In one of the preferred embodiments, the material is Kapton® with a thickness of 50 microns to ensure enough self-rigidity of the reflective film.

On one embodiment, a preformed CFRP sheet is provided with flat surfaces receiving the rows of solar cells 2 and wedge-like regions coated with a reflective layer or film to form the reflectors 3.

Figure 2:
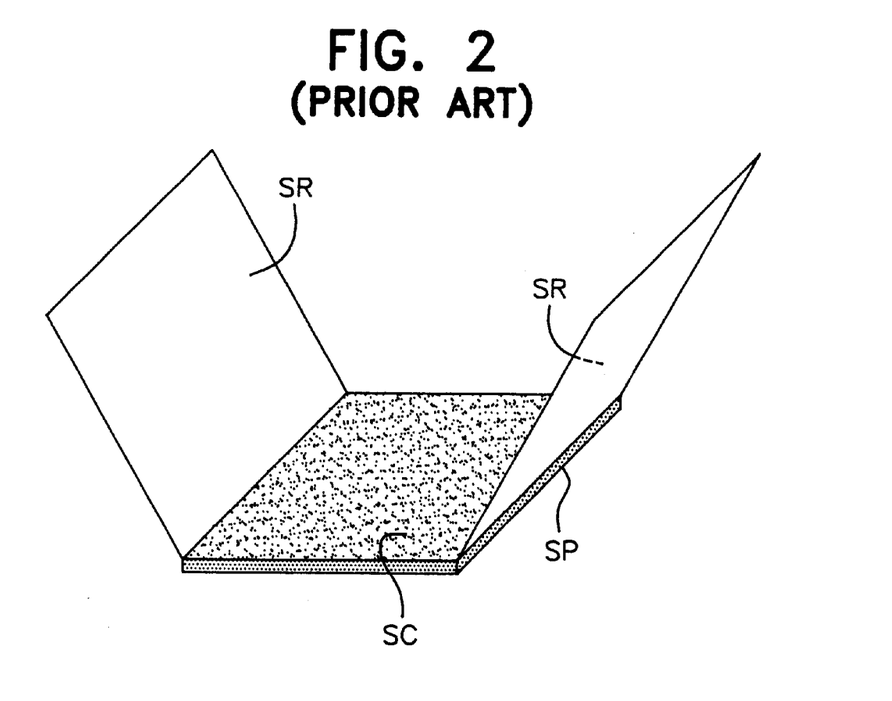
FIG. 2 illustrates a prior art devices according to U.S. Pat. Nos. 5,520,747, 6,017,002 or U.S. Pat. No. 6,050,526, i.e. a trough concentrator with reflectors adjacent to the solar panel. The concentration factor is 2:1.

The use of solar reflectors integrated in the solar panel allows for a more versatile and modular design of the deployed solar panel, compared with the prior art constructions where reflectors are adjacent to solar panels. Indeed, in the latter case, the solar panel deployment will more easily happen only in a one-dimensional sequence, accordion-type. For the sake of comparison, FIG. 2 depicts a prior art trough reflector concept with solar panels SP and solar cells SC and the same concentration factor of 2:1. It is deployable according to the concept described in U.S. Pat. Nos. 5,520,747, 6,017,002, and 6,050,526.

The present invention is still compatible with more complex deployment schemes like two-dimensional paving. The modularity is significantly improved and the power generation can be easily adapted to various level.

In the present invention, the collection surface is not significantly enlarged. It remains almost identical to the non concentration solar panel surface. The cooling surface is the panel rear surface which is facing the cold space environment. Since the sun irradiated surface and the cooling surface keep close values, only a small temperature increase is expected. The power conversion efficiency is better compared to trough concentrators. Indeed, in the prior art, the collection surface is almost doubled but the cooling surface remains the same. Significant temperature increase is observed (30–40 degrees Celsius). The cell efficiency is decreasing and the power generation is affected.

Figure 7A:
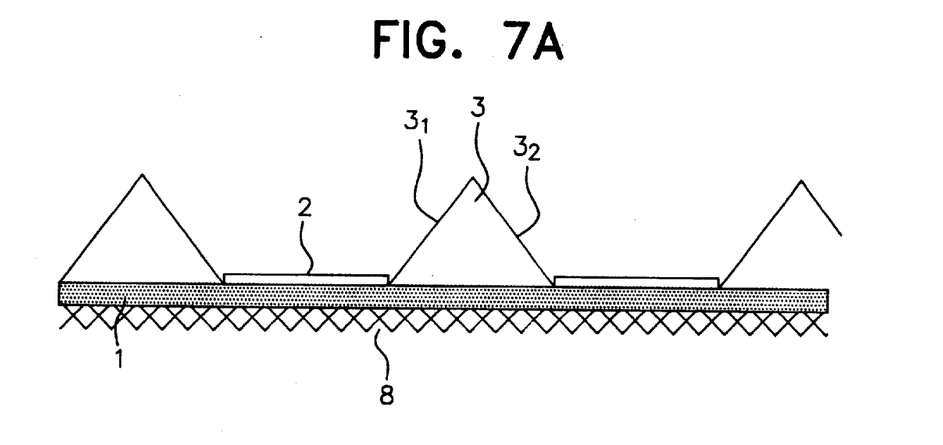
Figure 7B:
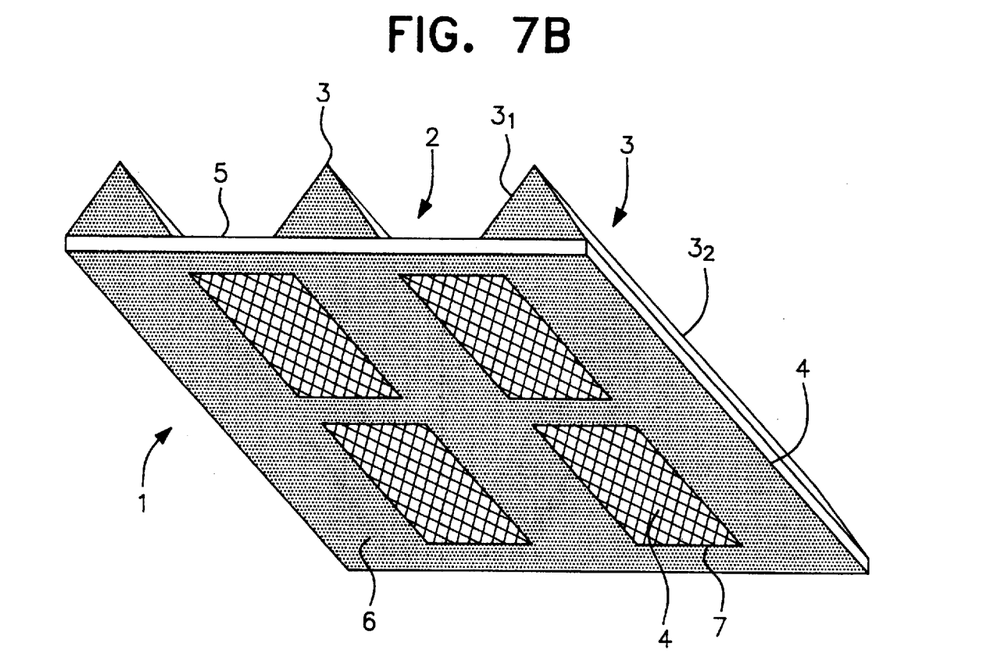

Thermal balance in the present invention may be optimised by maximising the cell cooling through an efficient radiative heat transfer to the rear side of the panel. This can be reached by using a honeycomb panel for the solar panel base 1. This honey-comb is comprised of an array 4 of honey-comb cells sandwiched between two face sheets 5 and 6. The honeycomb cells are preferably black-coated to increase emissivity. Then, the heat transfer from the rear side of the solar panel to the cold space is increased, and it can be further increased by using an additional array 8 of honeycomb with open cells, which is simply mounted to the rear side of the panel (FIG. 7A) and faces the cold space, acting like a radiative heat exchanger. These open cells are preferably coated with a high Infra-Red emissivity coating such the one named Martin Black®. In another embodiment depicted in FIG. 7B, the rear face sheet 6 made e.g. of CFRP is locally removed to form openings 7 to allow some of the honeycomb cells 4 of the panel sandwich 4, 5, 6 to directly face the cold space. Preferably, these openings 7 and hence the open honeycomb cells are located under the rows of the solar cells 2 and coated with a high Infra-Red emissivity coating. Of course, the implementation of this embodiment requires to take into account the panel stiffness. As an example, FIG. 7B shows an embodiment that makes use of a pattern of rear side strips of CFRP, allowing a better heat exchange to the cold space and a sufficient stiffness. Furthermore, one of the presented embodiments (FIG. 5D) shows that the structural stiffness of the reflectors 3 enhances the stiffness of the honey-comb panel stiffness. The mechanical requirement of the panel can thus be reached with a lower honeycomb thickness and/or can accommodate a removal of part of the rear face sheet 6 as shown in FIG. 7B. This is true for non-deployable reflectors or for deployable reflectors which, in their deployed position, contribute to the rigidity of the solar concentrator, with also a contribution from the deployment mechanism.

The weight may be reduced and the solar cell cooling enhanced thanks to better heat dissipation from the front to the rear side of the solar panel honeycomb forming the panel base 1.

The spacecraft pointing accuracy directly influences the design of solar concentrators. The reflectors should be compatible with the range of variation of the sun ray direction with respect to the solar panel. Body-stabilized spacecraft are not equipped with north-south tracking capability. The seasonal variation is ±23.5 degrees. For that reason, concentrators are not designed to perform concentration on that axis. Sun tracking is performed on the east-west axis with accuracy in the order of ±2 degrees. Concentrators are supposed to withstand slightly larger tracking errors for reliability insurance.

Figure 3A:
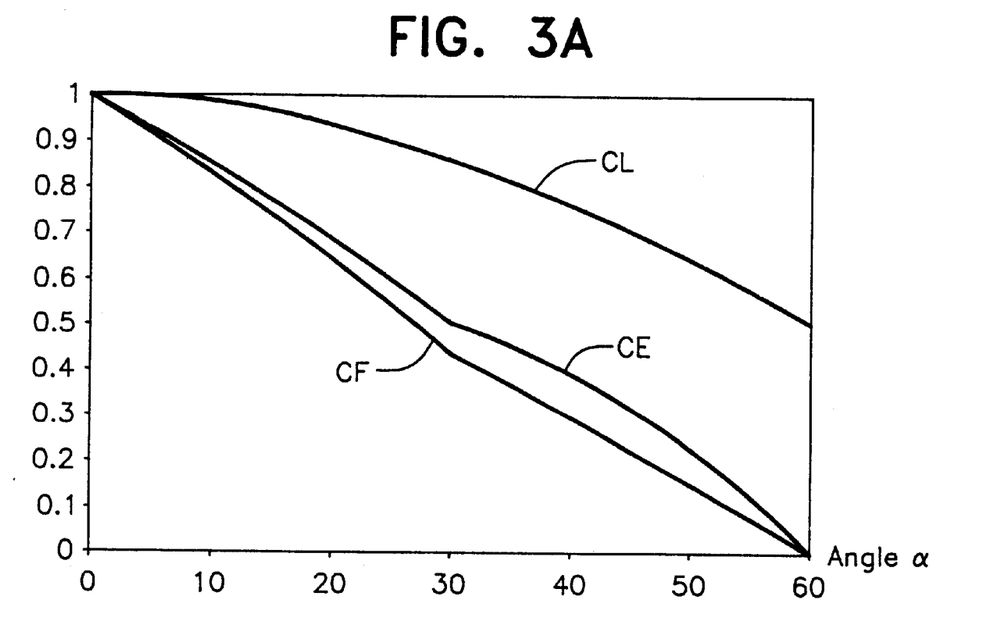
Figure 3B:
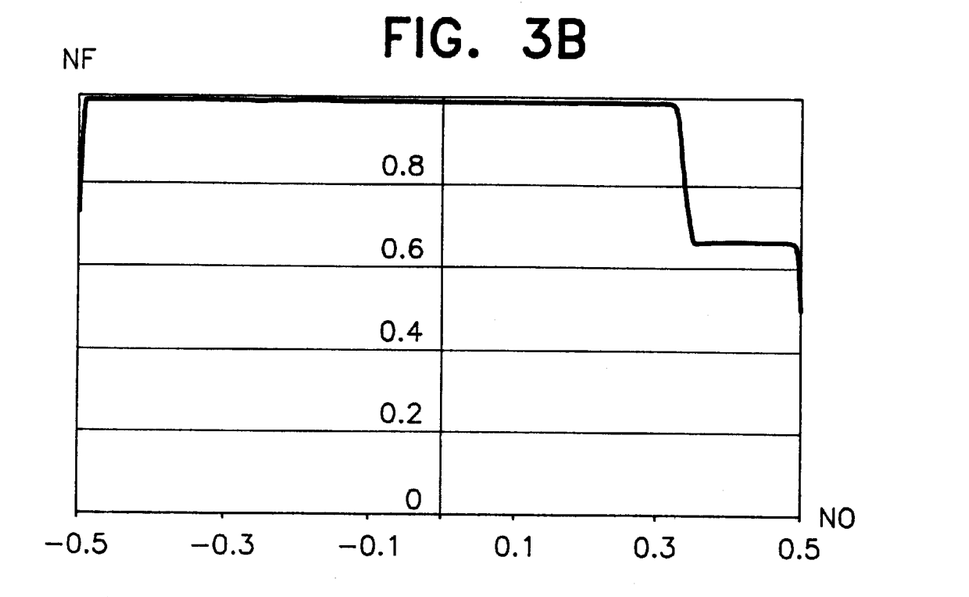

Referring to FIGS. 3A and 3B, consequence of pointing error is depicted. The simulation is true for both the saw-tooth concentrator of FIG. 1 and the prior art trough concentrator of FIG. 2 with a geometric concentration factor of 2:1. The off-pointing axis corresponds to the east-west roll of the spacecraft only. FIG. 3A shows the collection efficiency E versus the angle of incidence $\alpha$ of sun radiation. The first reason of efficiency loss is coming from the cosine law. The projected area is decreasing with a cosine law when the angle of incidence increases. This is true for any surface inclined with respect to the sun direction and it is not related to concentration. It is the main reason of sun tracking on any stabilized spacecraft.

The second loss factor is directly related to concentration. It shows an efficiency drop-off to 50% when the solar concentrator is at 30 degrees off pointing with respect to the sun. Zero collection occurs with 60 degrees off-pointing. FIG. 3B shows, in a realistic case when the off-pointing is only 3 degrees, the normalized flux NF, vs the normalized ordinate NO along the off-pointing axis. The distribution of light in between two reflectors is depicted. This area is occupied by solar cells. In the case of the present invention, referring to FIG. 1, this area is occupied by a row of solar cells. The normalized ordinate NO depicted in FIG. 3B corresponds to the width of each individual solar cell. In the case of the prior art, referring to FIG. 2, this area is the solar panel width, including several adjacent solar cells. The normalized ordinate NO depicted in FIG. 3B corresponds to the width of the solar panel. Any distribution non uniformity is reflected on the adjacent solar cells. Some cells will receive about 65% of the nominal flux NF. Power conversion will be affected by the same amount. The electric current generated by those cells will be 65% of the nominal current. Serial connections of cells require a high uniformity of generated current to collect the power from the whole solar panel. The non uniformity of light radiation will conduct to a significant decrease of available power to the spacecraft.

Referring to the present invention (FIG. 1), the non uniformity is existing too but at the cell width level only. The loss of light collection due to off-pointing is about 4.5%. The loss of cell power generation will be in the same order. Each cell will suffer from the same loss factor. The generated power is still uniform from cell to cell. The serial connection scheme along each row is still perfectly valid and no additional loss is expected.

The collection loss occurring during off-pointing is also depending on the concentration factor. For concentration lower than 2:1 (for instance 1.6:1 in the embodiment depicted by FIG. 5D), the loss is less sensitive to off-pointing.

The reflective coating on the saw-tooth (or roof-shaped) reflectors is preferably metallic and may be either aluminum or silver, or any efficient solar reflective coating or film. Aluminum is commonly used thanks to its manufacturing easiness and its good resistance to space environment (mainly radiation). Silver is not radiation-resistant, so that it needs to be over-coated with a transparent layer for which MgF2, TiO2, and SiO2 are good candidates, SiO2 being the cheapest of the three and being perfectly fitting with the solar spectrum requirement. Due to the requirement for over-coating, Ag is not as straightforward to handle as Al. The reason of interest on a Silver coated reflective film is due to its better reflectivity in the visible range. It is commonly admitted that VDA (Vaccum Deposited Aluminium) film gets a reflectivity of 89–91% and Silver film reaches 96–98% reflectivity under normal incidence in the visible spectral region. The spectral range is not limited to visible: multi-junction GaAs/Ge solar cells are sensitive from 350 to 900 nm. The solar flux is not flat over this spectral region : maximum intensity is reached at 450–500 nm. Flux drop-off occurs in the UV range. Slower decrease is observed in the red and IR.

Figure 4:
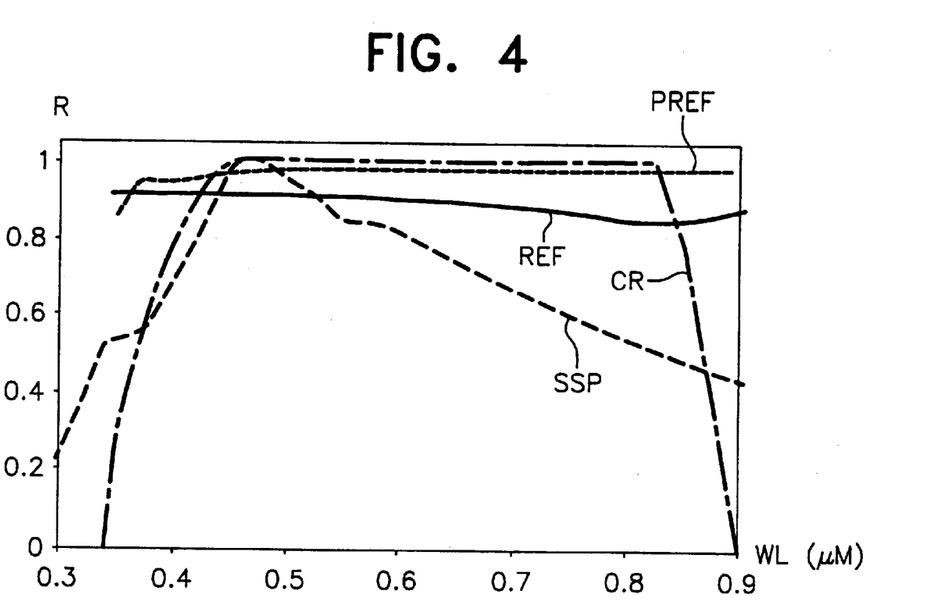
FIG. 4 shows a reflector film reflectivity R with 60 degrees incidence with respect to reflector normal for unpolarized light as a function of wavelength WL. The typical response CR of a multi-junction GaAs/Ge solar cell and the solar radiation spectrum SSP are also depicted. The reflectivity REF of vacuum deposited aluminum and over protected ($SiO_2$ 160 nm thick) silver PREF is depicted for comparison.

In one application, the interesting value is the reflectivity at 60 incidence instead of 0° (normal incidence). Referring to FIG.4, the reflectivity R at 60 degrees (with respect to reflector normal) of aluminum $R_{AR}$ and protected silver Rps film is depicted (unpolarized light). Silver protection is made of a 160 nm SiO2 layer. For understanding and calculation purposes, the solar flux spectrum and the photovoltaic cell response are depicted too (normalized under arbitrary units). Integral calculation were performed to find the average reflectivity of metallic films using solar flux spectrum and the photovoltaic cell response as weighting factors. The analysis proves an average reflectivity of 89% for Al and 97% for Ag+SiO2. It results a solar energy collection gain estimated to 4% for the whole solar panel. This is true for the present invention (FIG. 1) and for a panel according to the prior art (FIG. 2), with the same reflective coating.

Several options for mounting the film on the solar panel are possible. It depends on the requirement for reflector deployment. Weight of the panel is directly influenced. Detailed description of film mounting is given with reference to FIGS. 5A–E.

Figure 5A:
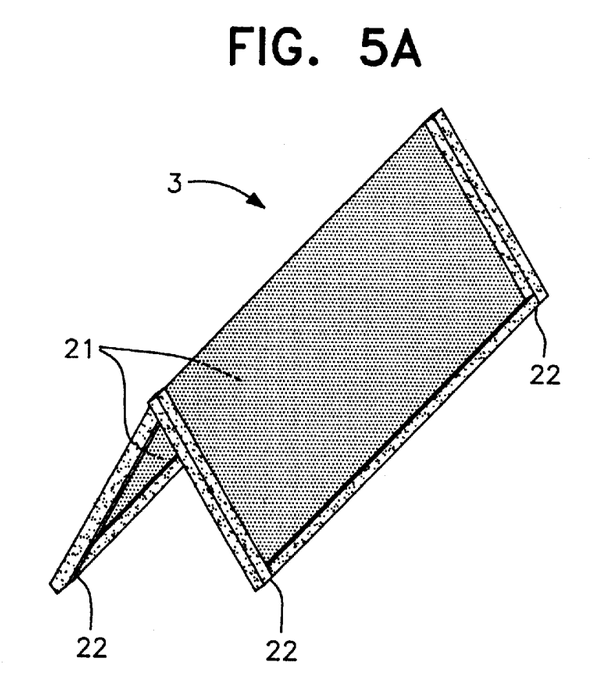

FIG. 5A shows (for simplication) only one saw-tooth reflector (not to scale) made of a reflector film 21 attached on a rigid frame 22, e.g by gluing. This frame 22 insures rigidity and tension of the film 21. Pre-load is required to produce a satisfying flatness of the reflector film 21. Frame material can be aluminum or nickel, for instance. In a preferred embodiment, aluminum is used for thermal reason (thermal expansion fitting well with Kapton® film) and for light-weight reason (density~2.7 g/cm$^2$). The film 21 is bonded to the frame 22 with glue. Two-component epoxy is well-suited to efficiently attach the aluminium film 21. The pre-load is produced by differential temperature of the film 21 and the metallic frame 22 during the gluing the frame 22 is kept at colder temperature than the film 21. Thanks to thermal shrinkage, the frame size 22 is slightly reduced. When glue curing is performed, the frame 22 and the film 21 are recovering the room temperature: the frame size slightly increases, which is producing the controlled tension of the film 21, thank to its elasticity.

Figure 5B:
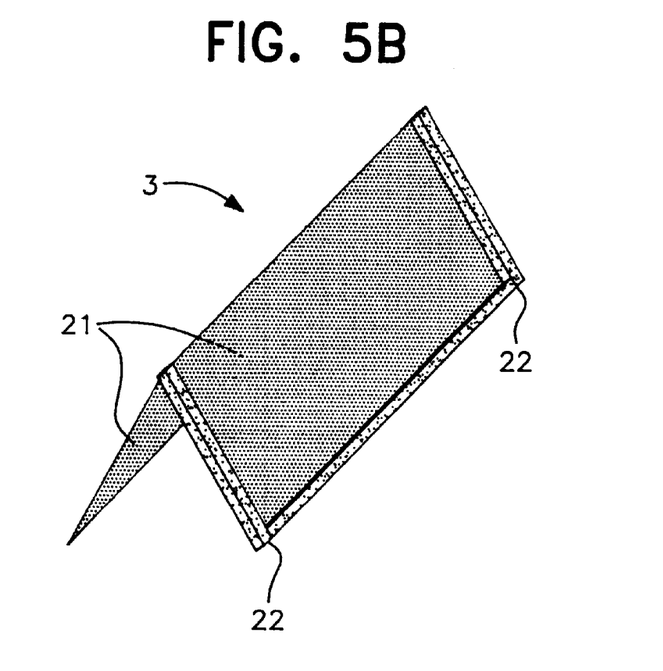

FIG. 5B shows another embodiment with the same concentrator where only one slope is equipped with a rigid frame 22. The other one is made of reflector film 21 only. In that case, the film is maintained under tension thanks to the upper attachment to the rigid frame 22 and lower attachment to the solar panel. Preferably, glue such as two component epoxy is used for efficient bonding. Reflectors are blocked at the nominal open position (nominal angle). In the case of a deployable concentrator, the reflective film may be folded under the rigid part in the stowed configuration.

Other means of bonding can also be used, such as ultrasonic soldering and laser welding. In any case, the frame material and the reflective film substrate 21 have to be selected in order to match the soldering conditions (local temperature gradients, adhesion, . . . ).

Figure 5C:
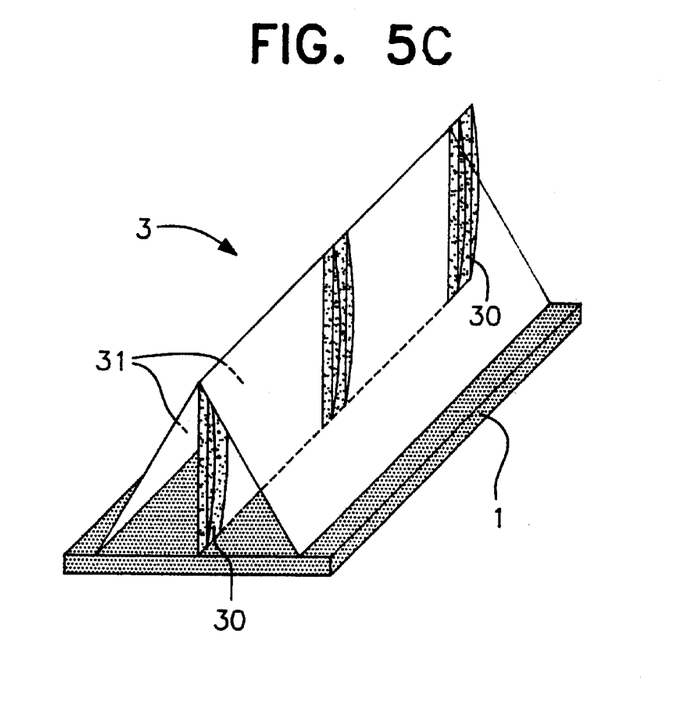

FIG. 5C shows a third embodiment where the reflective film 31 is maintained under tension within the correct flatness requirement thanks to rigid arms (possibly deployable/telescopic arms) for example as shown in U.S. Pat No. 5,244,508, but in a fully streched flat position. The reflector film edges are bonded to the solar panel. Lightweight rigid arms or bended arches are producing the adequate pre tension at the middle of the film width. This mechanism is locked after deployment to ensure reflector film tension with long lifetime (no relaxation). FIG. 6B depicts the stowed configuration related to this embodiment. The film is laying on the solar panel by adequate folding. A locking mechanism (not shown) prevents the film to slide on solar cells: no shadow of solar cells can occur in case of deployment failure. For deployment, the locking device is unlocked and the rigid arms (or bended arches) are fully deployed in vertical position, preferably in conjunction with the solar panel deployment sequence.

Figure 5D:
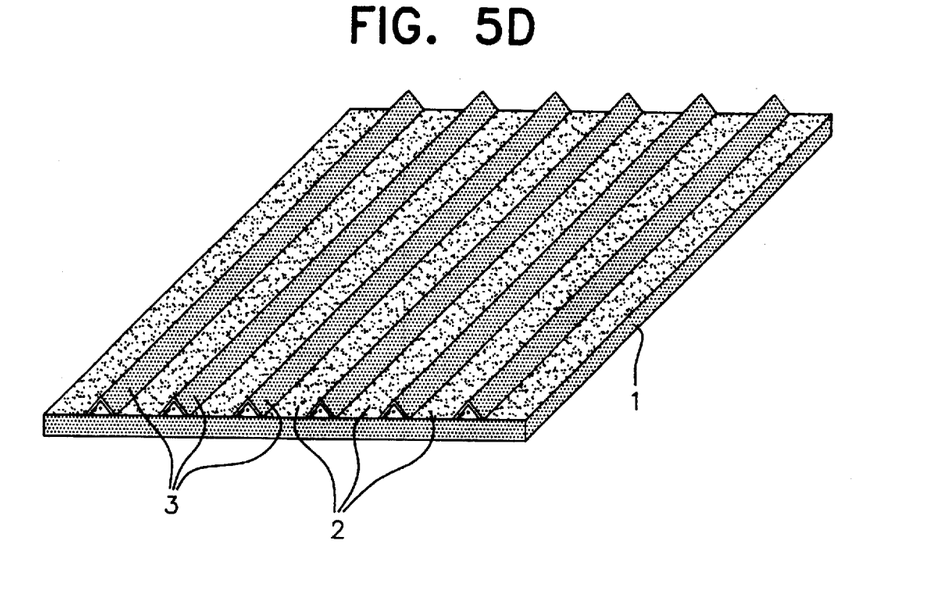

FIG. 5D relates to an embodiment with rigid saw tooth reflectors 3 having no deployment capability. A rigid reflector 3 is preferentially made of CFRP, which is the preferred material for the honeycomb face sheet of the solar panel. Typical thickness is 100 microns. A range from 50 to 200 micron thick CFRP reflector film is contemplated. It is very lightweight and stiff. Reflective film like Kapton® 25 micron thickness with metallic coating may be bonded on the saw tooth reflectors. High stiffness, good material compatibility, and high reliability (no deployment) characterize this embodiment of the invention. The reflector weight is slightly higher than in previous embodiment but, since no deployment and locking devices are required, the overall weight is still very attractive. It can easily remain lower than the weight of the equivalent solar cell row.

Figure 5E:
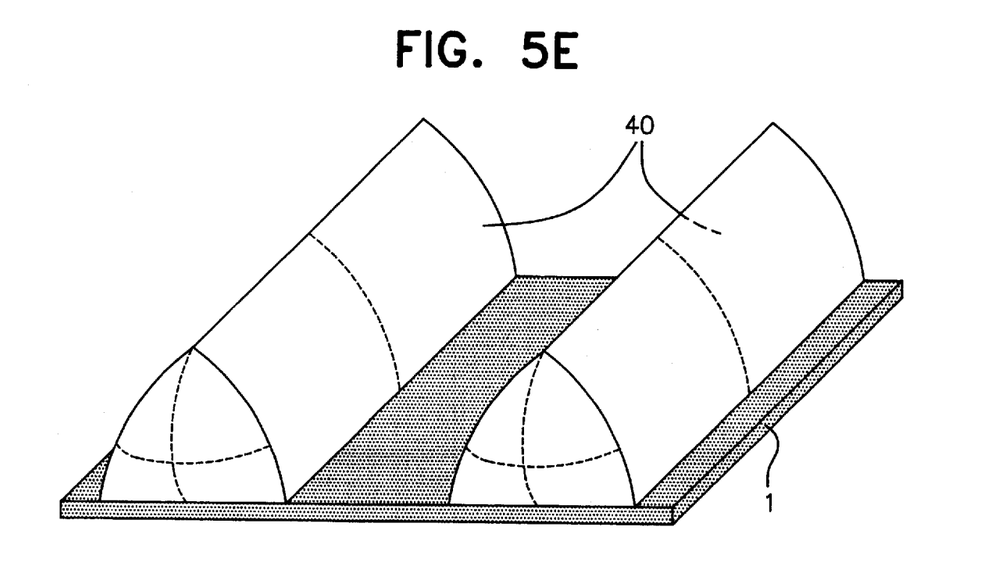

Referring to FIG. 5E, a new embodiment of the present invention uses an inflatable structure 40 to provide deployment with correct reflector shaping while inflated. Reflective coating is deposited on the inflatable body. The reflector shape can be optimized to produce a better illumination uniformity when small off-pointing occurs.

The sides $3_1$ and $3_2$ of a reflector may be flat or curved. The shape optimization is related to the illumination uniformity and concentration efficiency when small off-pointing occurs (2 degrees sun tracking error is often encountered). Shape accuracy is easier to reach with rigid reflectors than with deployable ones.

Since the solar panel thickness is increased by the integration of rigid reflectors, the preferred embodiment sown in FIG. 5D is producing a solar concentration of 1.6:1 instead of 2:1 for the above embodiments. The decrease of concentration allows for smaller aspect ratio. In the case of 40 mm width solar cell rows, the reflector height is reduced to 41% of that width (16.4 mm). It was 87% (34.7 mm) for producing a concentration factor of 2:1. The reflector angle is also adapted to that geometry (36.3 deg instead of 30 deg, with respect to the perpendicular to the solar panel).

Without concentrator, the overall solar panel thickness is typically 20 mm. This preferred embodiment (FIG. 5D) enlarges the overall thickness to 36 mm.

In a solar panel stowed configuration, the panel i is collapsed against the next panel (i+l) with a free space in between, typically 10–15 mm. The overall thickness of two stowed panel is, for instance, 50 mm (=20+10+20 mm), for panels with deployable or inflatable reflectors (such as the reflectors 40 shown in FIG. 5E). Damping spacers (not shown) are used to keep the free space during high vibration load (launch, for instance). It prevents shocks between collapsed panels which could brake solar cells.

Figure 6A:
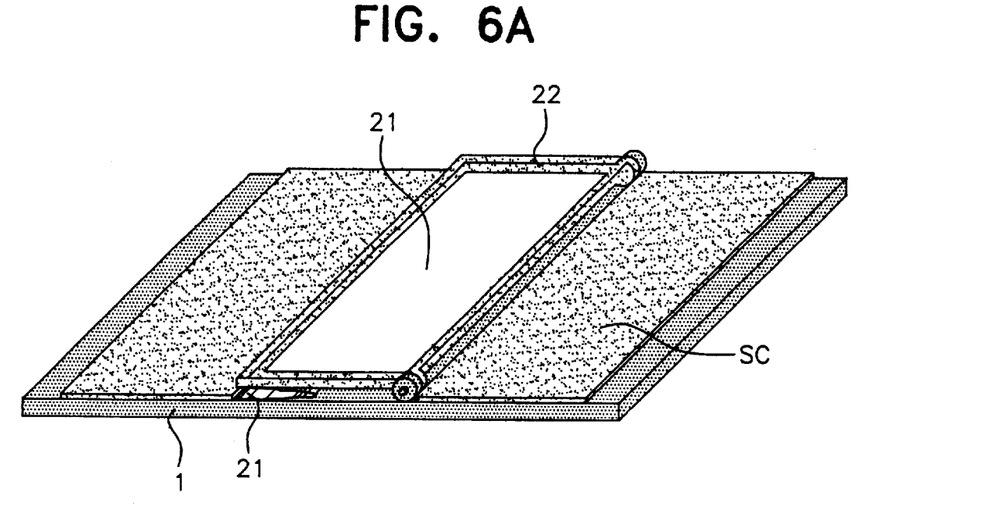
Figure 6B:
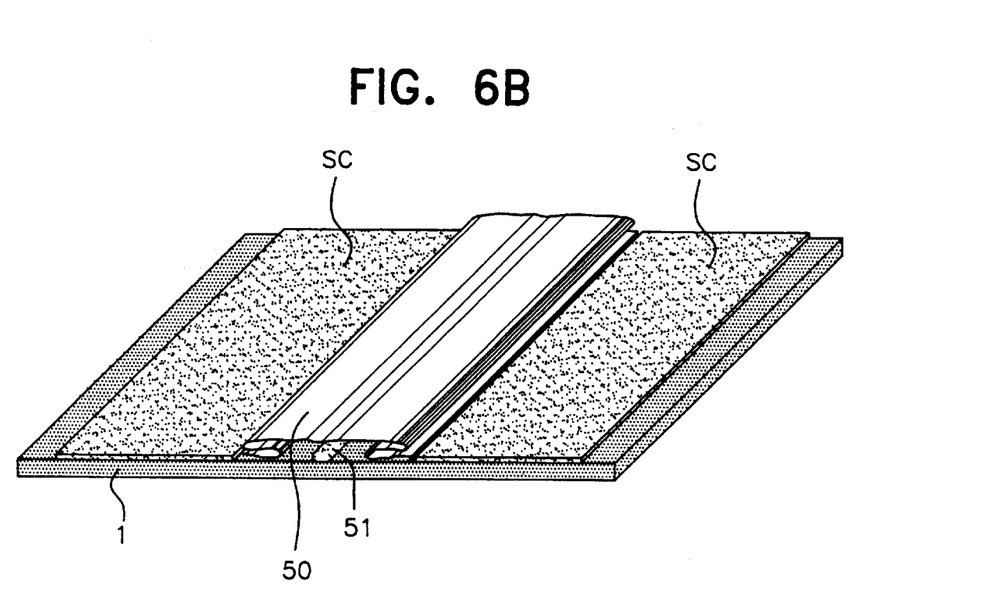
Figure 6C:
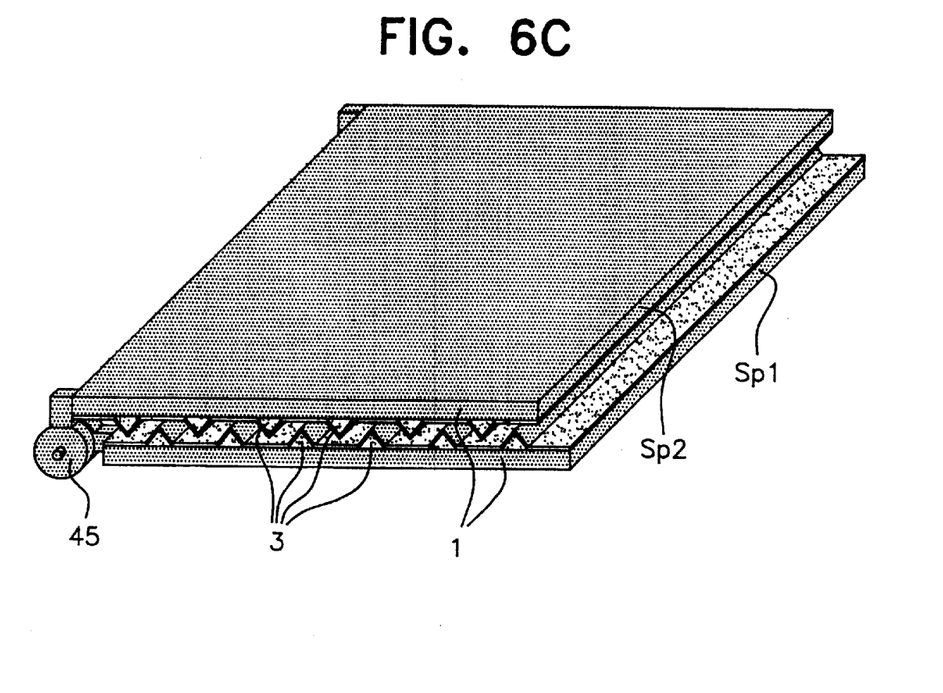

The stowing configuration may be adapted to take into account the thickness increase of the solar panel with, preferably rigid reflectors (not deployable) FIG. 6C shows the stowed configuration with two articulated (in 45) facing rigid panels SP1 and SP2 in which the reflectors 3 are interlaced. The overall thickness will be slightly enlarged but not significantly, since the reflectors 3 are alternated. If we keep for safety 5 mm free space between the reflector top and adjacent solar panel, the overall thickness of two stowed panel is, for instance, 61 mm (=20+16+5+20 mm). Two stowed panels require a thickness increase of only 11 mm (22%).

Moreover, the reflectors 3 also act as stiffening parts of the solar panel. If the panel structural design is adapted (for instance, lower honeycomb thickness), the total thickness of stowed panel could remain closer again to the original case (without concentrators). For instance, if the honeycomb thickness is decreased to 18 mm instead of 20 mm, the overall thickness of the two stowed concentrator panel from FIG. 6C is now 57 mm (=18+16+5+18 mm). Now, two stowed panels require a thickness increase of only 7 mm (14%).

In that configuration, reflectors will provide a more efficient cooling of cells. Since the honeycomb thickness is decreased, the thermal conductivity between the rear and the front side of the solar panel is enhanced. The lower solar cell temperature guarantees a better photovoltaic conversion of the cells.

Figure 8:
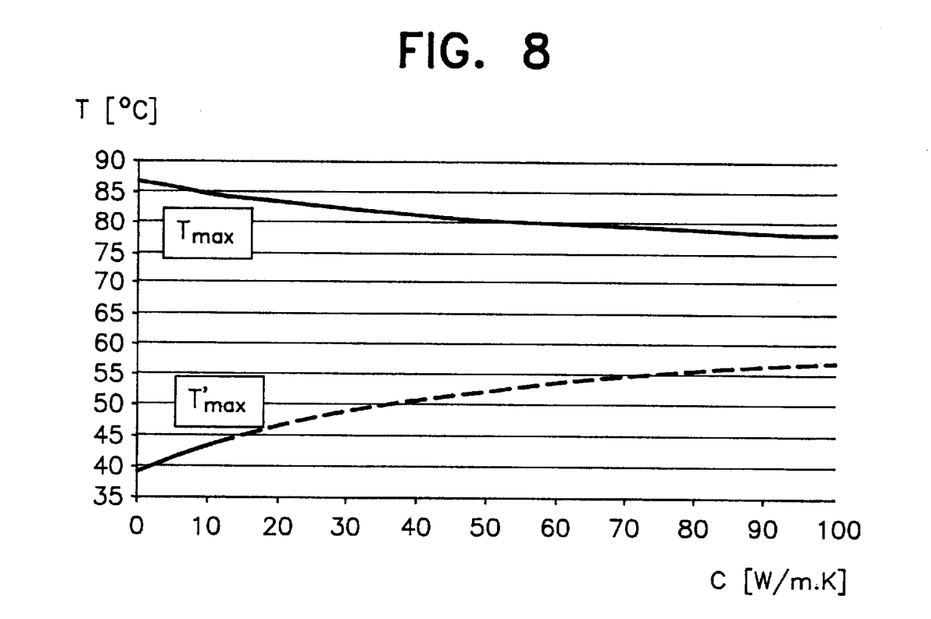
FIG. 8 shows maximum temperature (in ° C.) of the front face sheet below the solar cells ($T_{MAX}$) and below the reflectors ($T'_{MAX}$), versus the mean conductivity C of the CFRP face sheet when the solar panel is fully illuminated in geostationary orbit environment. The conductivity improvement is due to copper filaments included in the carbon fiber texture or in a specific "high conductivity" CFRP.

Thermal balance is an important aspect of the present invention. The cell cooling can be further improved by homogeneisation of the temperatures of the front face of the solar panel, that is the side facing the sun. As the temperature of the cells is higher than the temperature of the panel behind the reflector rows, use of high conductivity CFRP can be made for the front face sheet 5 and/or for the rear face sheet 6. Usual CFRP thermal conductivity ranges around 35 W/m.K. High conductivity CFRP can reach 370 to 700 W/m.K and shows much higher stiffness, that is 490 to 560 Gpa compared to 93 Gpa for usual CFRP. This makes this material preferable also to reach a higher panel overall stiffness. An improvement of the lateral thermal conductivity of the solar panel front face will be reached by this way. A layer of high conductivity CFRP can be simply added to the usual CFRP sheet to increase the conductivity and take benefit of the good thermal expansion matching. Another way can be to add high thermal conductivity filaments into or onto the usual CFRP, in a direction perpendicular to the solar cell rows, making a kind of thermal bridges between warmer area under the cells and colder area under the reflectors. These filaments can be mixed to the CFRP during manufacturing or added afterwards. As an example, an addition of copper filaments or other conductive material to the front face of the solar panel can improve the efficiency of the solar cells, such as shown in FIG. 8, where the maximum temperatures of the face sheet under the cells and under the reflectors are computed as function of the overall face sheet conductivity. This improvement, even small, can be reached without any significant weight penalty. As an example and according to FIG. 8, the use of high conductivity CFRP can lower the cell temperature by more than 5°.

In the stowed configuration, reflector elements are laying on each other on the solar panel surface. Reflectors are not stored over the solar cell in order to allow for power generation during first phases after launch or in case of deployment failure. This is a drawback of prior art that the present invention can solve.

According to a second aspect of the invention involving the deployment of the reflectors, a shadowing of solar cells is prevented (see FIG. 6A). A blocking mechanism (not shown) is required to prevent any spring relaxation as foreseen in the prior art. The weight of the film may be very low (typically, 50 microns thickness: 71 g/m²). In the embodiment of FIG. 6A, the major weighting parts are the rigid frame 22 and any mechanical element required for stowage locking, deployment and final blocking. The use of only one frame 22 (as in FIG. 5B) and very simple deployment provides a lower weight for this second embodiment. The deployment mechanism could be a spring without locking in stowed configuration as mentioned in the prior art (WO 00/79593 A1). However, in a preferred embodiment, a locking device is added. The reflectors are no more self-deployable. They need an external force (preferably coupled with the solar panel deployment mechanism) to produce the unlocking and start the deployment. The reliability of such a mechanism can be very high, especially when coupled with panel deployment sequence. The additional weight should remain low by using low density space-qualified materials like aluminum. The main advantage compared to prior art is the fact that, in the stowed solar panel position, the reflectors are not touching each others and scratches are prevented on the reflective coating.

What is claimed is:

1. A solar concentrator comprising rows of solar cells alternating with reflectors having two planar or bent sides extending as a hollow wedge along said rows, at least one honeycomb panel having a front face sheet on which the reflectors and rows of solar cells are mounted, a rear face sheet, and a honeycomb array of cells sandwiched therebetween, characterized in that the honeycomb array of cells are black coated.

2. A solar concentrator comprising rows of solar cells alternating with reflectors having two planar or bent sides extending as a hollow wedge along said rows, at least one honeycomb panel having a front face sheet on which the reflectors and rows of solar cells are mounted, a rear face sheet and a honeycomb array of cells sandwiched therebetween, characterized in that, on at least part of the surface of said honeycomb panel, the honeycomb cells have an open end on the rear face sheet.

3. The solar concentrator as in claim 2, characterized in that the rear face sheet has openings so that cells of the honeycomb array of cells have the open end in the openings.

4. The solar concentrator as in claim 3, characterized in that the openings are at least partly located under the rows of solar cells.

5. The solar concentrator as in claim 2 further comprising a second honeycomb array of cells fixed to the rear face sheet.

6. A solar concentrator comprising rows of solar cells alternating with reflectors having two planar or bent sides extending as a hollow wedge along said rows, at least one honeycomb panel having a front face sheet on which the reflectors and rows of solar cells are mounted, a rear face sheet, and a honeycomb array of cells sandwiched therebetween, characterized in that the solar concentrator has a geometric concentration between 1.4/1 and 2/1.

7. A solar concentrator comprising rows of solar cells alternating with reflectors having two planar or bent sides extending as a hollow wedge along said rows, at least one honeycomb panel having a front face sheet on which the reflectors and rows of solar cells are mounted, a rear face sheet, and a honeycomb array of cells sandwiched therebetween, characterized in that at least some of the reflectors are made of a film reinforced with a frame on at least one of their sides.

8. The solar concentrator as in claim 6, characterized in that the honeycomb array of cells are black coated.

9. The solar contractor as in claim 6, characterized in that, on at least part of the surface of said honeycomb panel, the honeycomb cells have an open end on the rear face sheet.

10. The solar concentrator as in claim 9, characterized in that the rear face sheet has openings so that cells of the honeycomb array of cells have the open end in the openings.

11. The solar concentrator as in claim 10, characterized in that the openings are at least partly located under the rows of solar cells.

12. The solar concentrator as in claim 9, further comprising a second honeycomb array of cells fixed to the rear face sheet.

13. The solar concentrator as in claim 6, characterized in that the honeycomb array of cells is made of aluminum.

14. The solar concentrator as in claim 6, characterized in that at least one face sheet (5, 6) is comprised of a carbon fiber reinforced polymer.

15. The solar concentrator as in claim 6, characterized in that the front face sheet comprises a preformed sheet having a flat region on which said rows of solar cells are mounted, alternating with regions of the reflectors coated with a reflective layer.

16. The solar concentrator as in claim 15, characterized in that said preformed sheet is comprised of a carbon fiber reinforced polymer.

17. The solar concentrator as in claim 15, characterized in that the reflectors are coated with metal.

18. The solar concentrator as in claim 15, characterized in that said preformed sheet and/or at least one face sheet is made of a carbon fiber reinforced polymer having a thermal conductivity of at least 370 W/m K.

19. The solar concentrator as in claim 15, characterized in that said preformed sheet and/or at least one of said face sheets is made of a polymer comprising thermally conductive filaments oriented in a mean direction that is perpendicular to the longitudinal axis of the solar cell rows.

20. The solar concentrator as in claim 7, characterized in that the solar concentrator has a geometric concentration between 1.4/1 and 2/1.

21. The solar concentrator as in claim 6, characterized in that the reflectors are non-deployable.

22. The solar concentrator as in claim 6, characterized in that the reflectors are deployable.

23. The solar concentrator as in claim 22, characterized in that, in their stowed position, the reflectors do not overlap the solar cell rows.

24. The solar concentrator as in claim 6, comprising at least two honeycomb panels having a stowed, articulated configuration in which the two honeycomb panels are folded one on the other, in which position the reflectors are interlaced.

25. The solar concentration as in claim 17, characterized in that the reflectors are silver overcoated with a radiation protective transparent layer.

26. The solar concentrator as in claim 20, characterized in that the geometric concentration is equal to 1.6/1.

* * * * *